(12) United States Patent
Kwok et al.

(10) Patent No.: US 10,014,411 B2
(45) Date of Patent: Jul. 3, 2018

(54) MODULATING GERMANIUM PERCENTAGE IN MOS DEVICES

(71) Applicant: Taiwan Semiconductor Manufacturing Company, Ltd., Hsin-Chu (TW)

(72) Inventors: Tsz-Mei Kwok, Hsin-Chu (TW); Kun-Mu Li, Zhudong Township (TW); Hsueh-Chang Sung, Zhubei (TW); Chii-Horng Li, Zhubei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 139 days.

(21) Appl. No.: 15/152,260

(22) Filed: May 11, 2016

(65) Prior Publication Data
US 2016/0254381 A1     Sep. 1, 2016

Related U.S. Application Data

(63) Continuation of application No. 14/691,435, filed on Apr. 20, 2015, now Pat. No. 9,362,360, which is a (Continued)

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02532* (2013.01); *H01L 21/28518* (2013.01); *H01L 21/30604* (2013.01); *H01L 21/32053* (2013.01); *H01L 21/823425* (2013.01); *H01L 27/088* (2013.01); *H01L 29/0847* (2013.01); (Continued)

(58) Field of Classification Search
CPC .................. H01L 29/7848; H01L 29/66636
See application file for complete search history.

(56) References Cited

U.S. PATENT DOCUMENTS

| 7,534,689 B2 | 5/2009 | Pal et al. |
| 7,865,852 B2 | 1/2011 | Chen |

(Continued)

FOREIGN PATENT DOCUMENTS

| CN | 101577265 A | 11/2009 |
| CN | 101963755 A | 2/2011 |

(Continued)

*Primary Examiner* — Roy Potter
*Assistant Examiner* — Paul Patton
(74) *Attorney, Agent, or Firm* — Slater Matsil, LLP

(57) ABSTRACT

An integrated circuit structure includes a gate stack over a semiconductor substrate, and an opening extending into the semiconductor substrate, wherein the opening is adjacent to the gate stack. A first silicon germanium region is disposed in the opening, wherein the first silicon germanium region has a first germanium percentage. A second silicon germanium region is overlying the first silicon germanium region, wherein the second silicon germanium region has a second germanium percentage higher than the first germanium percentage. A metal silicide region is over and in contact with the second silicon germanium region.

20 Claims, 12 Drawing Sheets

Related U.S. Application Data continuation of application No. 13/963,855, filed on Aug. 9, 2013, now Pat. No. 9,012,964.

(51) Int. Cl.

| | | |
|---|---|---|
| *H01L 29/165* | (2006.01) | |
| *H01L 27/088* | (2006.01) | |
| *H01L 29/08* | (2006.01) | |
| *H01L 29/45* | (2006.01) | |
| *H01L 29/40* | (2006.01) | |
| *H01L 21/8234* | (2006.01) | |
| *H01L 29/417* | (2006.01) | |
| *H01L 21/285* | (2006.01) | |
| *H01L 21/02* | (2006.01) | |
| *H01L 21/3205* | (2006.01) | |
| *H01L 29/167* | (2006.01) | |
| *H01L 21/306* | (2006.01) | |
| *H01L 21/3065* | (2006.01) | |
| *H01L 21/308* | (2006.01) | |
| *H01L 21/768* | (2006.01) | |

(52) U.S. Cl.
CPC .......... *H01L 29/165* (2013.01); *H01L 29/167* (2013.01); *H01L 29/401* (2013.01); *H01L 29/41783* (2013.01); *H01L 29/45* (2013.01); *H01L 29/456* (2013.01); *H01L 29/6659* (2013.01); *H01L 29/66507* (2013.01); *H01L 29/66545* (2013.01); *H01L 29/66628* (2013.01); *H01L 29/66636* (2013.01); *H01L 29/7833* (2013.01); *H01L 29/7834* (2013.01); *H01L 21/3065* (2013.01); *H01L 21/3086* (2013.01); *H01L 21/30608* (2013.01); *H01L 21/76843* (2013.01); *H01L 21/76855* (2013.01); *H01L 29/665* (2013.01)

(56) References Cited

U.S. PATENT DOCUMENTS

| | | | |
|---|---|---|---|
| 8,120,120 | B2 | 2/2012 | Yang et al. |
| 8,431,239 | B2 | 4/2013 | Bae et al. |
| 8,448,120 | B2 | 5/2013 | Huang et al. |
| 2008/0197412 | A1* | 8/2008 | Zhang ................. H01L 29/0847 257/344 |
| 2008/0246057 | A1* | 10/2008 | Lin ....................... H01L 29/165 257/190 |
| 2008/0303060 | A1 | 12/2008 | Han et al. |
| 2008/0313576 | A1 | 12/2008 | Kosowsky et al. |
| 2009/0108308 | A1 | 4/2009 | Yang et al. |
| 2010/0171181 | A1 | 7/2010 | Rhee et al. |
| 2011/0014765 | A1 | 1/2011 | Fukuda et al. |
| 2011/0024804 | A1 | 2/2011 | Chang et al. |
| 2012/0056245 | A1 | 3/2012 | Kang et al. |
| 2015/0021696 | A1 | 1/2015 | Sung et al. |

FOREIGN PATENT DOCUMENTS

| | | |
|---|---|---|
| CN | 102682143 A | 9/2012 |
| CN | 104299970 A | 1/2015 |
| JP | 2010219249 A | 9/2010 |
| KR | 20090091788 A | 8/2009 |
| KR | 20100081667 A | 7/2010 |
| KR | 20120025314 | 3/2012 |

\* cited by examiner

MODULATING GERMANIUM PERCENTAGE IN MOS DEVICES

This application is a continuation of U.S. patent application Ser. No. 14/691,435, filed on Apr. 20, 2015, and entitled "Modulating Germanium Percentage in MOS Devices," which claims the benefit to and is a continuation of U.S. patent application Ser. No. 13/963,855, filed on Aug. 9, 2013, now U.S. Pat. No. 9,012,964 issued Apr. 21, 2015, entitled "Modulating Germanium Percentage in MOS Devices" which applications are hereby incorporated herein by reference.

BACKGROUND

Metal-Oxide Semiconductor (MOS) devices are key components of integrated circuits. The performance of MOS devices affects the performance of the entire integrated circuits in which the MOS devices are located. Therefore, methods for improving the performance of the MOS devices have been studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

To further enhance the performance of MOS devices, stress may be introduced in the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

An available method for applying compressive stress to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses, and annealing. Since SiGe has a lattice constant greater than that of silicon, it applies a compressive stress to the channel region, which is located between a source SiGe stressor and a drain SiGe stressor.

A process for forming a Metal-Oxide-Semiconductor (MOS) device with stressors is provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
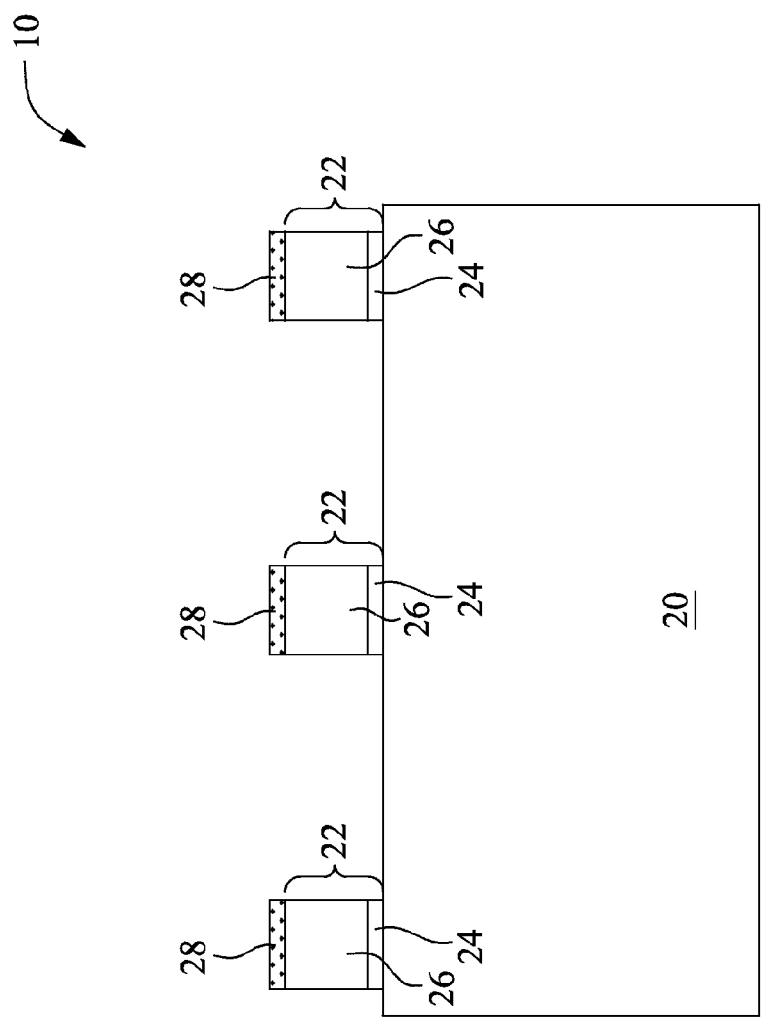
FIGS. 1 through 10 are cross-sectional views of intermediate stages in the manufacturing of a Metal-Oxide Semiconductor (MOS) device in accordance with some exemplary embodiments.

FIG. 1 illustrates substrate 20, which is a portion of wafer 10. Substrate 20 may be a bulk semiconductor substrate such as a silicon substrate, or may have a composite structure such as a Silicon-On-Insulator (SOI) structure. Alternatively, other semiconductor materials that include group III, group IV, and/or group V elements may also be comprised in substrate 20, which semiconductor materials may include silicon germanium, silicon carbon, and/or III-V compound semiconductor materials.

Gate stacks 22 are formed over substrate 20, and include gate dielectrics 24 and gate electrodes 26. Gate dielectrics 24 may comprise silicon oxide and/or a high-k material having a high k value, for example, higher than about 7. Gate electrodes 26 may include commonly used conductive materials such as doped polysilicon, metals, metal silicides, metal nitrides, and combinations thereof. Gate stacks 22 may also include hard masks 28, which may comprise silicon nitride, for example, although other materials such as silicon carbide, silicon oxynitride, and the like may also be used.

Figure 2:
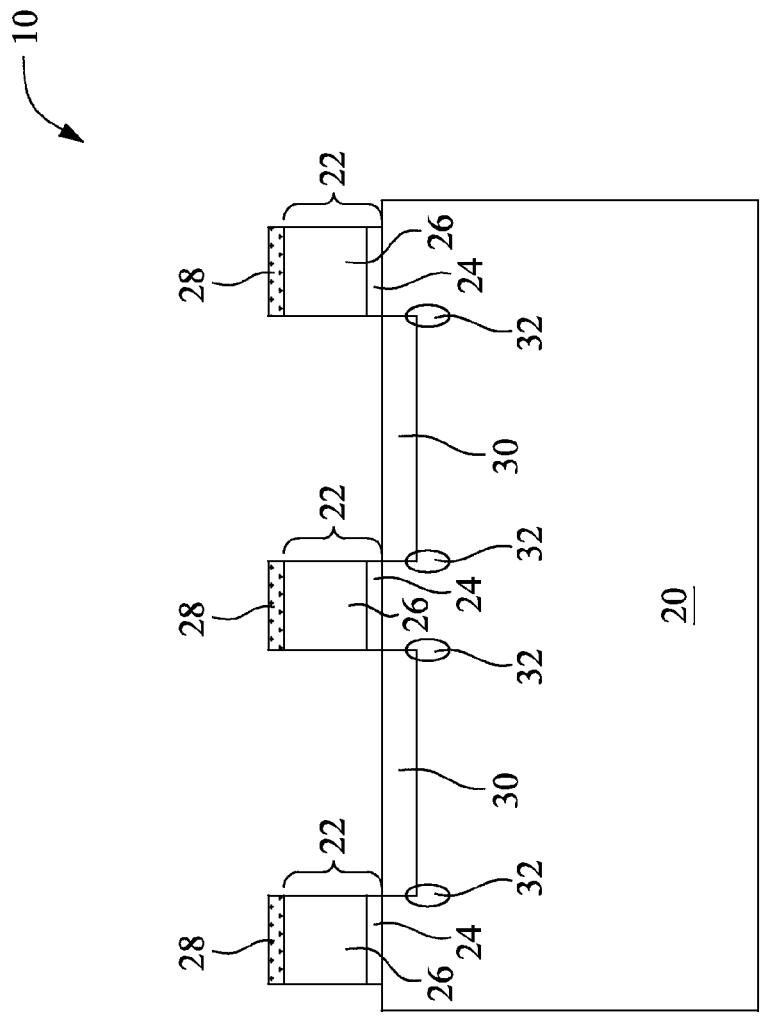

As shown in FIG. 2, Lightly Doped Drain/source (LDD) regions 30 are formed, for example, by implanting a p-type impurity such as boron and/or indium into substrate 20. Gate stacks 22 and hard masks 28 act as implantation masks so that the inner edges of LDD regions 30 are substantially aligned with the edges of gate stacks 22, respectively. The LDD implantation may be performed using energies in a range between about 1 keV and about 10 keV, and a dosage in a range between about $1 \times 10^{13}/cm^2$ and about $1 \times 10^{16}/cm^2$. It is appreciated, however, that the values recited throughout the description are merely examples, and may be changed to different values. The LDD implantation may be tilted or vertical, with the tilt angle in a range between about 0 degree and about 30 degrees. In addition, pocket regions 32 may also be formed, for example, by implanting an n-type impurity such as arsenic, phosphorous, or the like into substrate 20. The pocket implantation may be tilted, with the tilt angle greater than the tilt angle of the LDD implantation. In some embodiments, the tilt angle of the pocket implantation is in a range between about 15 degree and about 45 degrees. For clarity, pocket regions 32 are not illustrated in subsequent drawings.

Figure 3:
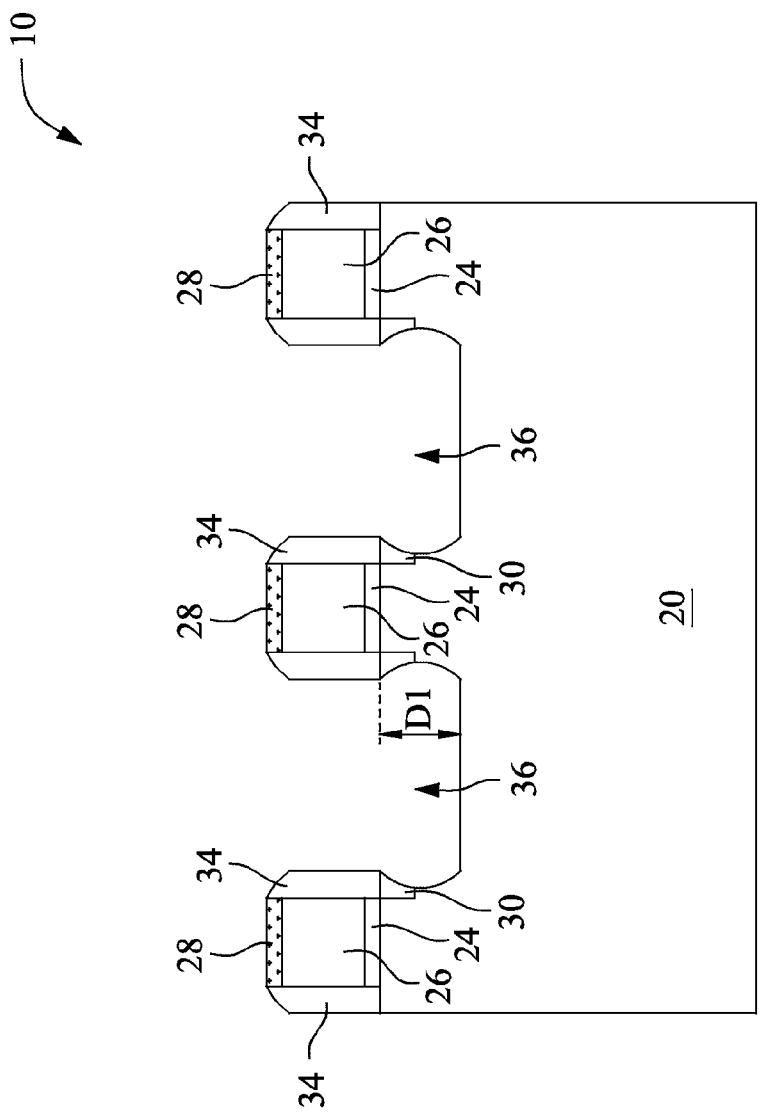

Referring to FIG. 3, gate spacers 34 are formed on the sidewalls of gate dielectrics 24 and gate electrodes 26. In some embodiments, each of gate spacers 34 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

As also shown in FIG. 3, in accordance with some embodiments, an isotropic etch may be performed to form openings 36 in substrate 20. The isotropic etch may be a dry etch, wherein the etching gas may be selected from $CF_4$, $Cl_2$, $NF_3$, $SF_6$, and combinations thereof. Depth D1 of opening 36 may be in a range between about 150 Å and about 500 Å, for example. In alternative embodiments, the isotropic etch step in FIG. 3 is skipped, and the step in FIG. 4 is formed to form openings 36 as shown in FIG. 4.

Figure 4:
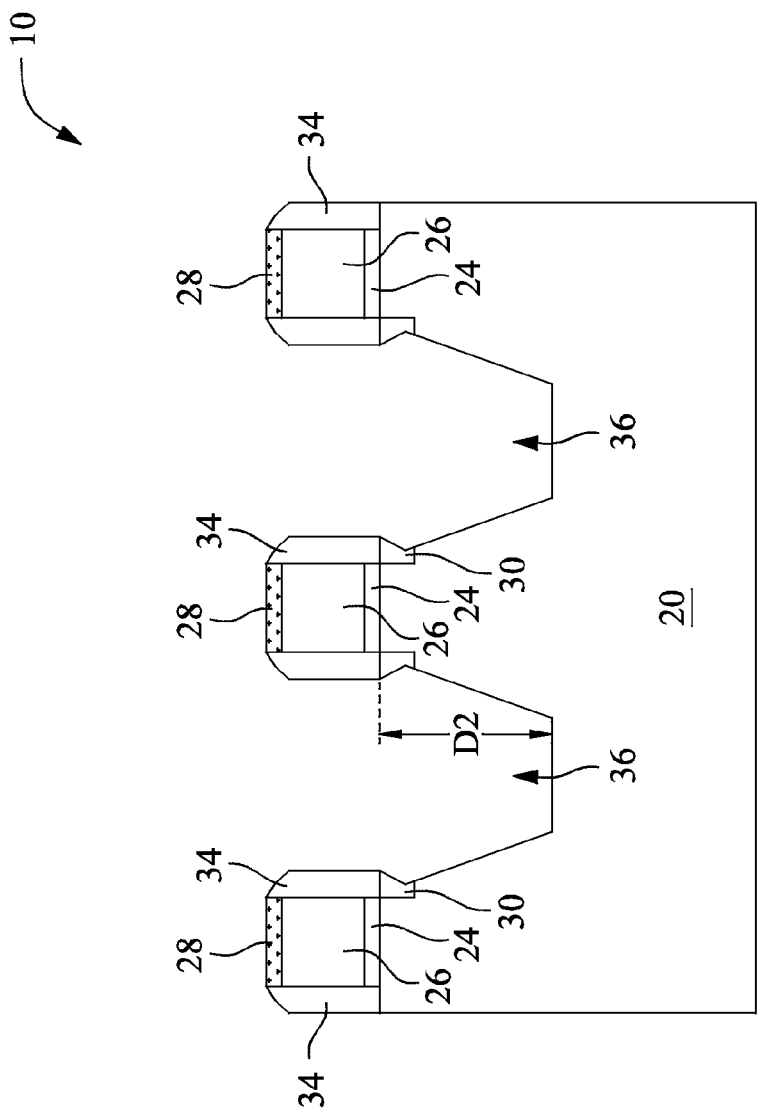

Next, as shown in FIG. 4, a wet etch is performed to expand openings 36, The wet etching may be performed, for example, using Tetra-Methyl Ammonium Hydroxide (TMAH), a potassium hydroxide (KOH) solution, or the like. In some exemplary embodiments, the TMAH solution has a concentration in a range between about 1 percent and about 30 percent. After the wet etching, facets may be formed in openings 36, which facets include (111) planes of substrate 20. In some exemplary embodiments, after the wet etching, depth D2 of openings 36 may be in a range between about 300 Å and about 800 Å, for example.

A pre-clean may be performed, for example, using an HF-based gas or a SiCoNi-based gas. The pre-clean may remove any undesirable silicon oxide that is formed as a result of the nature oxidation of the exposed surfaces in openings 36.

Figure 5:
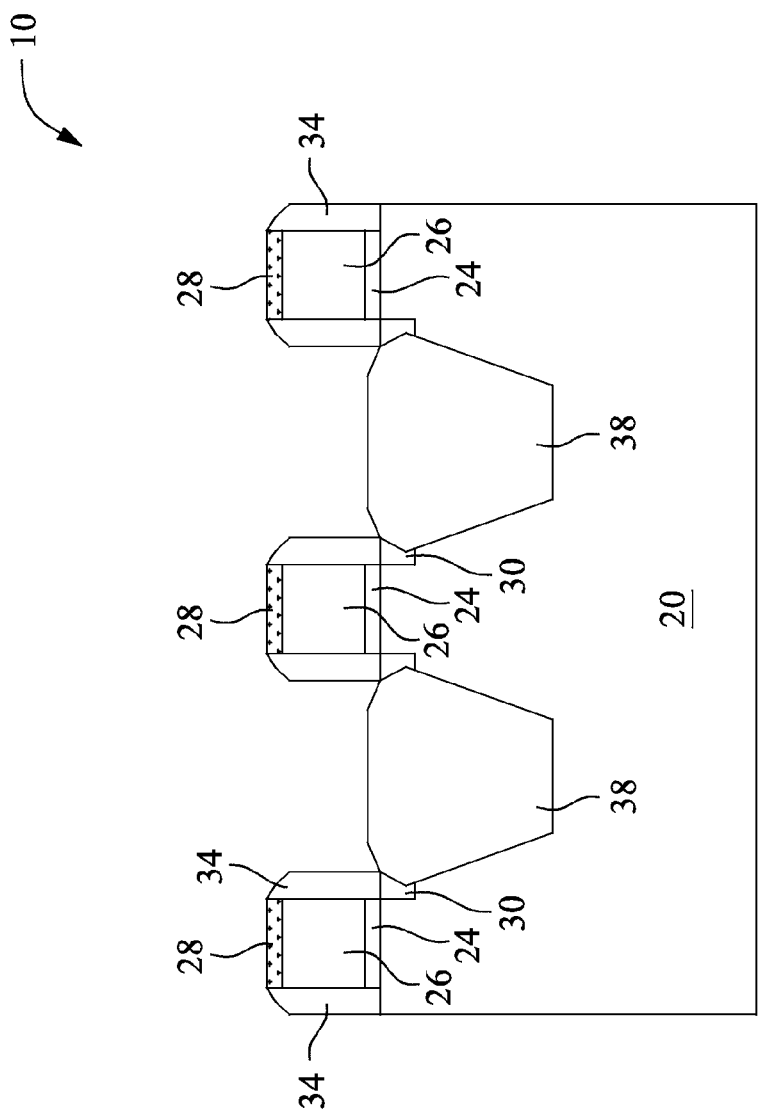

FIG. 5 illustrates the formation of epitaxy regions 38. During the epitaxy, a semiconductor material such as silicon germanium (SiGe) is epitaxially grown in openings 36 (FIG. 4) through Selective Epitaxial Growth (SEG), forming epitaxy region(s) 38. Hence, throughout the description, epitaxy regions 38 are also referred to as SiGe regions 38. The process gases may include $H_2$, $N_2$, dichloro-silane (DCS), $SiH_4$, $GeH_4$, and/or the like. The temperature of wafer 10 during the epitaxy may be in a range between about 500° C. and about 900° C. In some embodiments, an etching gas is added to promote the selective growth on the exposed surfaces of substrate 20, but not on dielectrics such as gate spacers 34 and hard masks 28. The pressure of the process gases may be in a range between about 10 torr and about 200 torr.

During the epitaxy, desired p-type impurities may be doped while the growth proceeds. For example, when boron is to be doped, $B_2H_6$ may be included in the process gases. In some embodiments, the impurity concentration of the p-type impurities in epitaxy regions 38 is between about $5E18/cm^3$ and about $5E21/cm^3$. In alternative embodiments, during the epitaxy of SiGe regions 38, no p-type impurity is in-situ doped, or substantially no p-type impurity (for example, with a p-type impurity concentration lower than about $10^{14}/cm^3$) is doped. In these embodiments, the source and drain regions of the respective MOS device are formed in a subsequent step through implantation. Epitaxy regions 38 may have a first germanium atomic percentage in a range between about 30 percent and about 60 percent, for example, although different germanium percentages may also be used. In some embodiments, the top surfaces of epitaxy regions 38 are level with or higher than the interface between substrate 20 and gate dielectrics 24.

Figure 6:
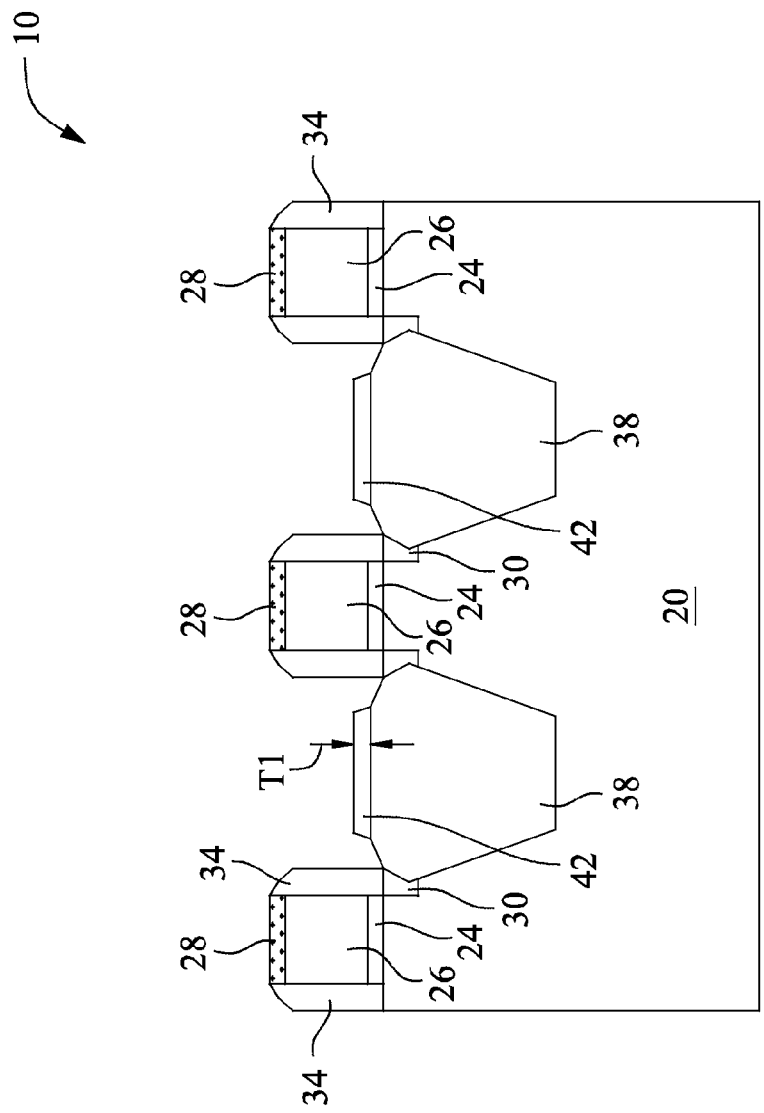

Referring to FIG. 6, epitaxy layers 42 are grown over epitaxy regions 38 through an epitaxy process. In some embodiments, epitaxy layers 42 are SiGe layers, which have a germanium atomic percentage higher than the germanium atomic percentage in epitaxy regions 38. In some embodiments, epitaxy layers 42 have a second germanium atomic percentage in a range between about 35 percent and about 80 percent. Throughout the description, epitaxy layers 42 are also referred to as piled-up SiGe regions due to their high germanium percentage. The difference between the germanium atomic percentage of piled-up SiGe regions 42 and SiGe regions 38 may also be greater than about 5 percent. The difference may also be in the range between about 5 percent and about 20 percent. The process conditions for forming piled-up SiGe regions 42 may be similar to the process conditions for forming epitaxy regions 38, except that the ratios of silicon-containing gases to germanium-containing gases are adjusted differently. Epitaxy regions 38 and 42 in combination form parts of the source and drain regions (and also the source or drain stressors) of a MOS device, which also includes one gate stack 22 as its gate. Piled-up SiGe regions 42 have a small thickness T1, which may be smaller than about 10 nm. Thickness T1 may also be between about 1 nm and about 10 nm in some embodiments.

Furthermore, during the epitaxy for forming piled-up SiGe regions 42, a p-type impurity may be in-situ doped with the proceeding of the epitaxy. In alternative embodiments, during the epitaxy of SiGe layers 42, no p-type impurity is in-situ doped, or substantially no p-type impurity (for example, with a p-type impurity concentration lower than about $10^{14}/cm^3$) is doped.

In some embodiments, in each of epitaxy regions 38 and 42, the germanium percentage is substantially uniform. In alternative embodiments, either one or both of epitaxy regions 38 and 42 has a gradually and continuously changed germanium percentage. During the respective epitaxy, the flow rate of the germanium-containing precursor (such as $GeH_4$) may be gradually and continuously changed. In these embodiments, in the layer in which the germanium percentage gradually changes, the lower portions of the layer have germanium percentages lower than the germanium percentages of the upper layers.

Figure 7:
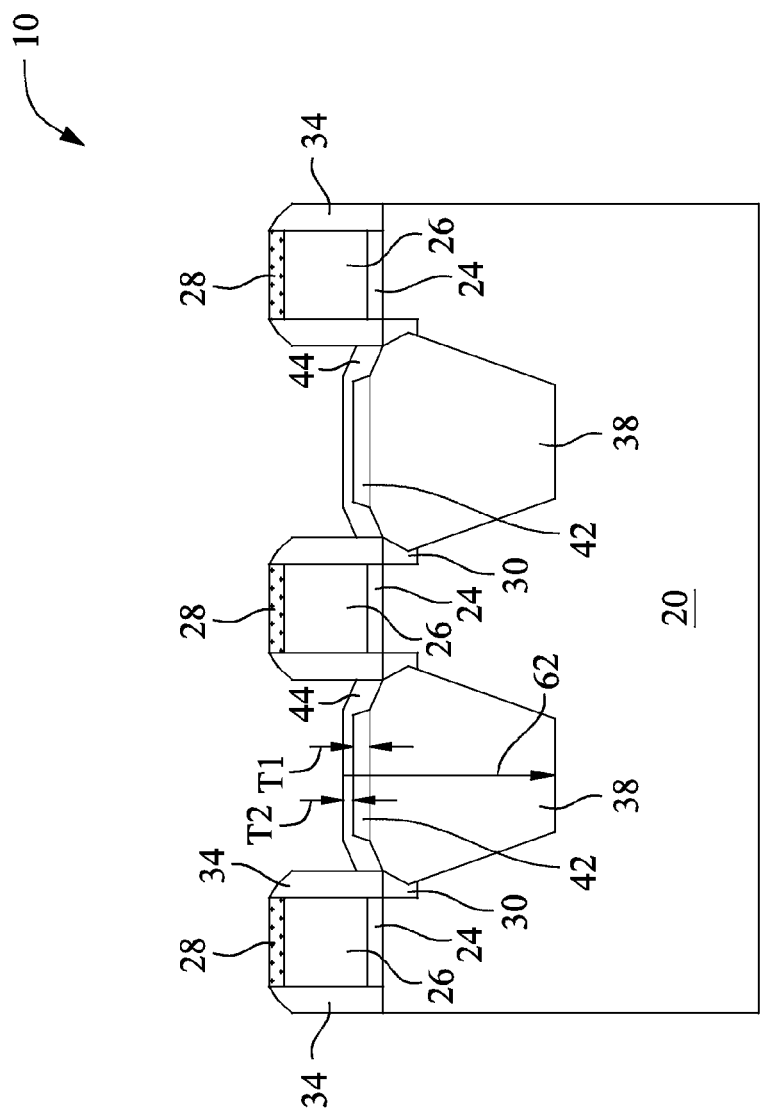

After the formation of piled-up SiGe regions 42, capping layers 44 are formed over piled-up SiGe regions 42 through epitaxy, as shown in FIG. 7. Capping layers 44 may have a composition (including the elements contained therein and the percentages of the elements) different from the composition of piled-up SiGe regions 42. Capping layers 44 may be pure silicon layers with no germanium comprised therein, or substantially pure silicon layers with, for example, less than 2 percent, or 1 percent, germanium. Accordingly, capping layers 44 are alternatively referred to as silicon caps throughout the description. Capping layer 44 may be in-situ doped with p-type impurities with the proceeding of the epitaxy, or not in-situ doped. In the embodiments that no p-type impurity or substantially no p-type impurity is doped during the epitaxy of SiGe regions 38, 42, and/or capping layers 44, a p-type impurity implantation may be performed to form source and drain regions for the respective MOS device.

Figure 11:
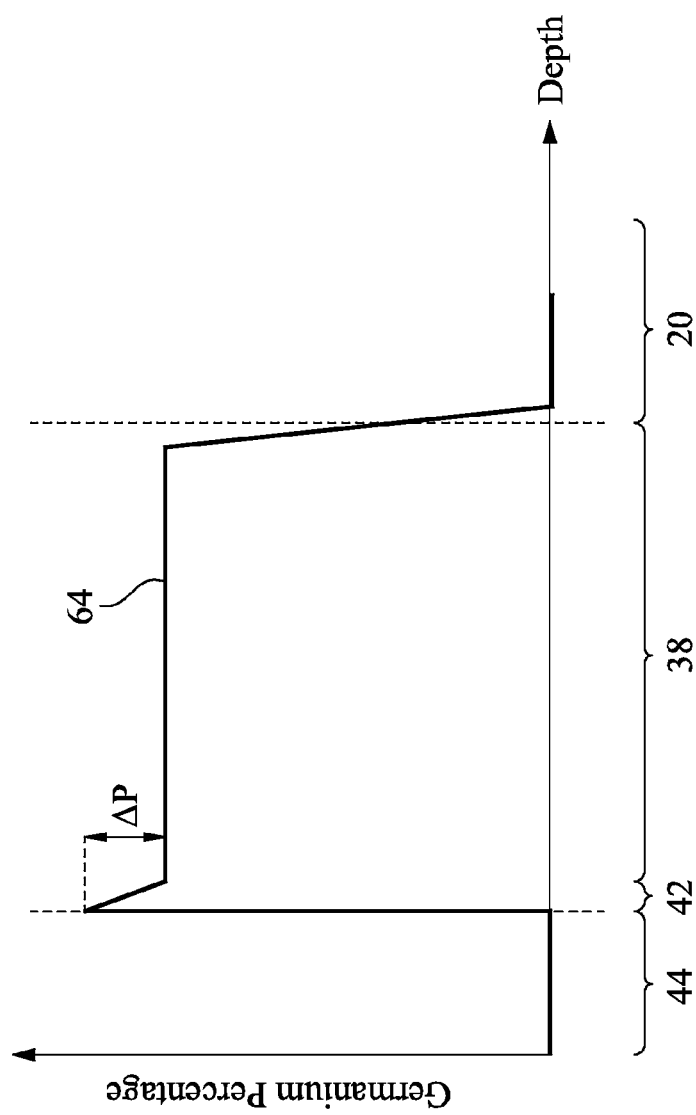
FIG. 11 schematically illustrates exemplary profiles of germanium percentages in the epitaxy regions of the MOS device in accordance with some embodiments.

FIG. 11 schematically illustrates the germanium profile (line 64) in the illustrated regions in FIG. 7, wherein the profile represents the germanium percentage along the path of arrow 62 in FIG. 7. The respective regions 38, 42, and 44 are also illustrated to show the correspondence between the germanium percentages and the respective regions. The X-axis represents the depth measured starting from the top surface of capping layers 44 (FIG. 7). The Y-axis indicates the germanium percentage. Since FIG. 11 is schematic, the values of the X-axis and the Y-axis are not marked. As shown in FIG. 11, the germanium percentage in capping layers 44 is very low, and may be equal to zero percent. In piled-up SiGe regions 42, the germanium percentage is significantly higher than that in capping layers 44 and the underlying epitaxy regions 38. The germanium percentage in piled-up SiGe regions 42 is higher than the germanium percentage in epitaxy layer 38 by a difference ΔP, which may be in the range from about 5 percent to about 20 percent.

Referring back to FIG. 7, epitaxy regions 42 have thickness T1, and capping layers 44 have thickness T2 greater than thickness T1. Thickness T2 may also be significantly greater than thickness T1, for example, with ratio T2/T1 being greater than about 2. Ratio T2/T1 may also be in the range between about 2 and about 10 in some exemplary embodiments. Maintaining thickness T2 greater than thickness T1 is beneficial for reducing the morphology degradation in the resulting source and drain silicide regions. If thickness T2 is equal to or smaller than thickness T1, due to the high germanium percentage, the morphology degradation in the resulting silicide region caused by the silicidation of piled-up regions 42 is severe, and may cause segregation in the silicide region, and in turn cause reliability problems.

Figure 8:
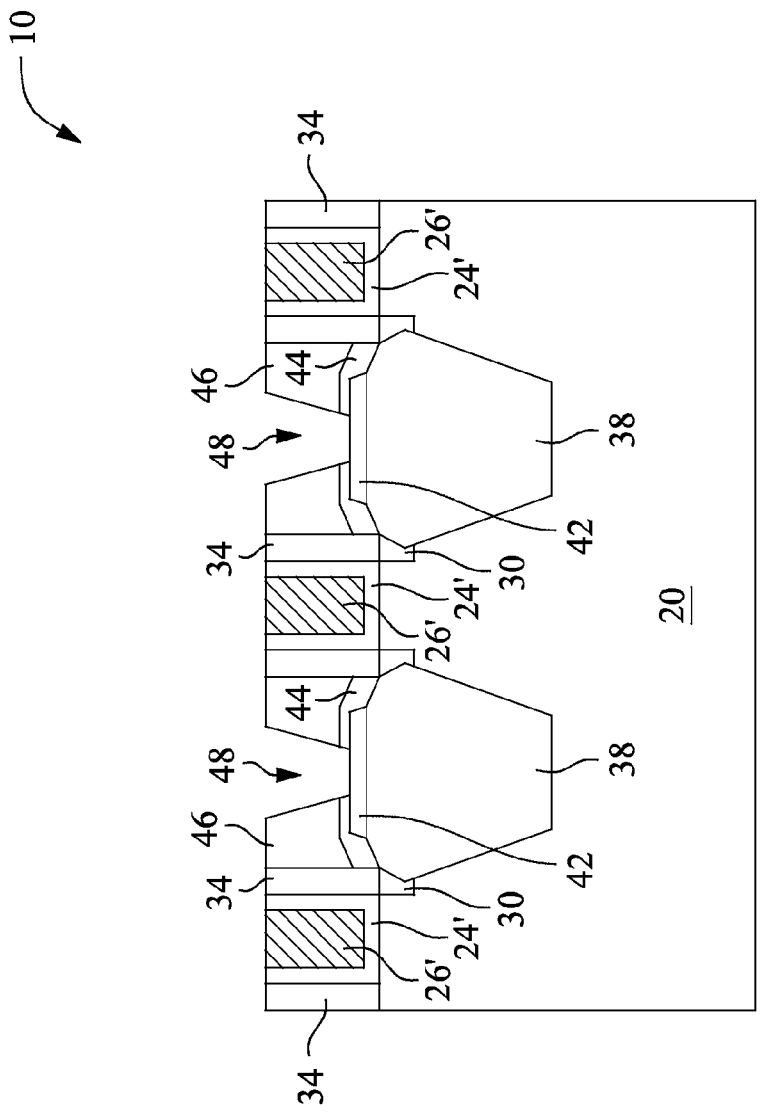

Next, hard masks 28, if any, are removed, and replacement gates are formed to replace gate dielectrics 24 and gate electrodes 26 in accordance with some embodiments, as shown in FIG. 8. In alternative embodiments, gate dielectrics 24 and gate electrodes 26 (FIG. 7) are not replaced with replacement gates. In the embodiments replacement gates are formed, gate dielectrics 24 and gate electrodes 26 act as dummy gates. FIG. 8 illustrates an exemplary structure including the replacement gates. The formation process may include forming Inter-Layer Dielectric (ILD) 46, performing a CMP to level the top surfaces of ILD 46 with the top surface of gate electrodes 26 or hard mask 28 (if any), and removing the dummy gates. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 24' and gate electrodes 26'. Gate dielectrics 24' may comprise a high-k dielectric material with a k value greater than about 7.0, for example, and gate electrodes 26' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. Next, contact openings 48 are formed, exposing underlying capping layers 44.

Figure 9:
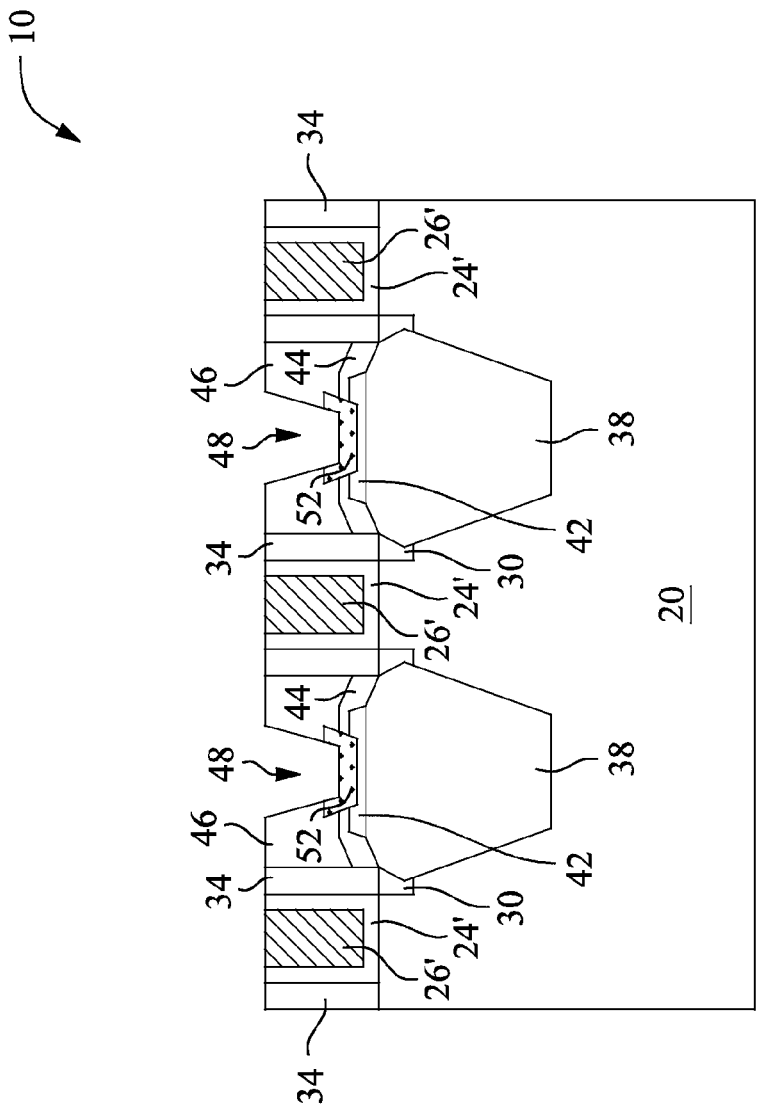

FIG. 9 illustrates the formation of source/drain silicide regions 52. Silicide regions 52 may be formed by depositing a thin layer (not shown) of a silicide metal, such as titanium, cobalt, nickel, tungsten, or the like, over the devices, including the exposed surfaces of capping layers 44. Wafer 10 is then heated, which causes the silicide reaction to occur wherever the metal is in contact with silicon. As a result of the reaction, a layer of metal silicide is formed between silicon/SiGe and the metal. The un-reacted metal is selectively removed through the use of an etchant that attacks metal but does not attack silicide. As a result of the silicidation, source/drain silicide regions 52 extend into and penetrate through capping layers 44. Source/drain silicide regions 52 may be in contact with piled-up SiGe regions 42. In some exemplary embodiments, a top layer of each of piled-up SiGe regions 42 is silicided, while a bottom layer of each of piled-up SiGe regions 42 remains un-silicided. Accordingly, the bottom layers of piled-up SiGe regions 42 have top surfaces contacting the bottom surfaces of source/drain silicide regions 52, and bottom surfaces contacting the top surfaces of epitaxy regions 38. Furthermore, the top layers of epitaxy regions 42 may be level with, and on a side of, the respective adjacent silicide regions 52.

Figure 10:
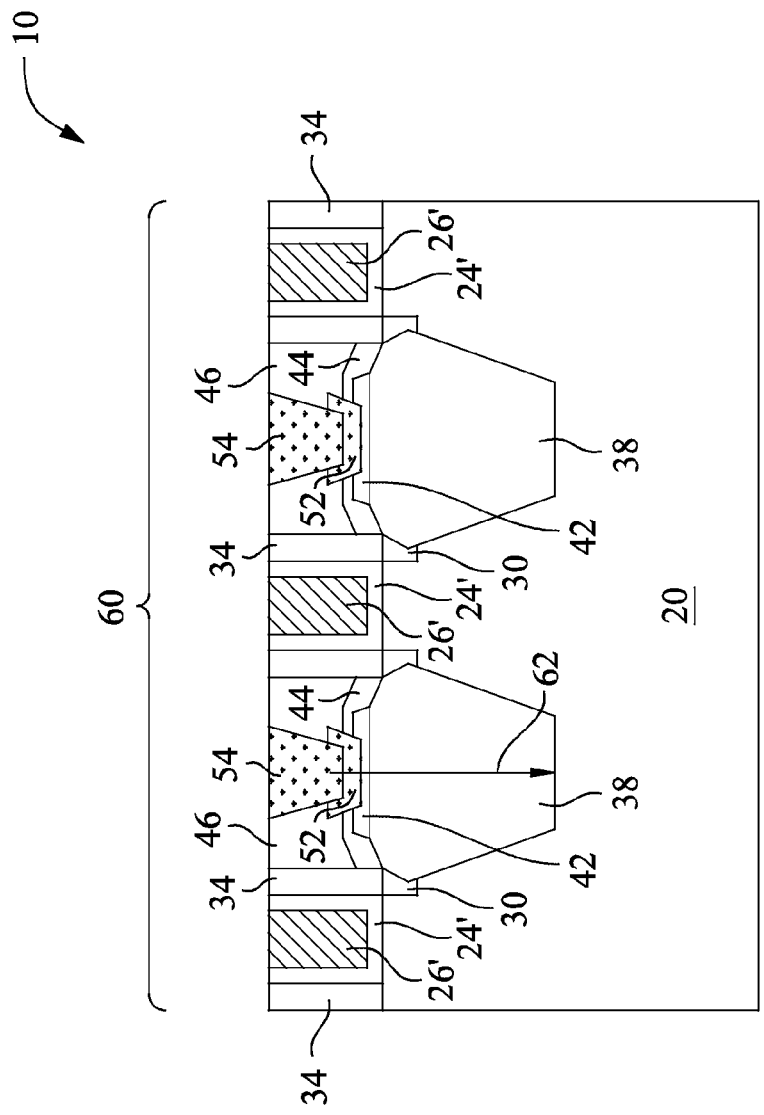

FIG. 10 illustrates the formation of source/drain contact plugs 54, which are formed by filling a conductive material such as tungsten, copper, aluminum, titanium, cobalt, silicon, germanium, and/or the like, into openings 48 (FIG. 9), and performing a CMP to level the top surface of contact plugs 54 with the top surface of ILD 46. The formation of MOS transistor 60 is thus finished. MOS transistor 60 includes epitaxy regions 38, 42, and possibly the remaining portions of capping layers 44 as the source and drain regions.

Figure 12:
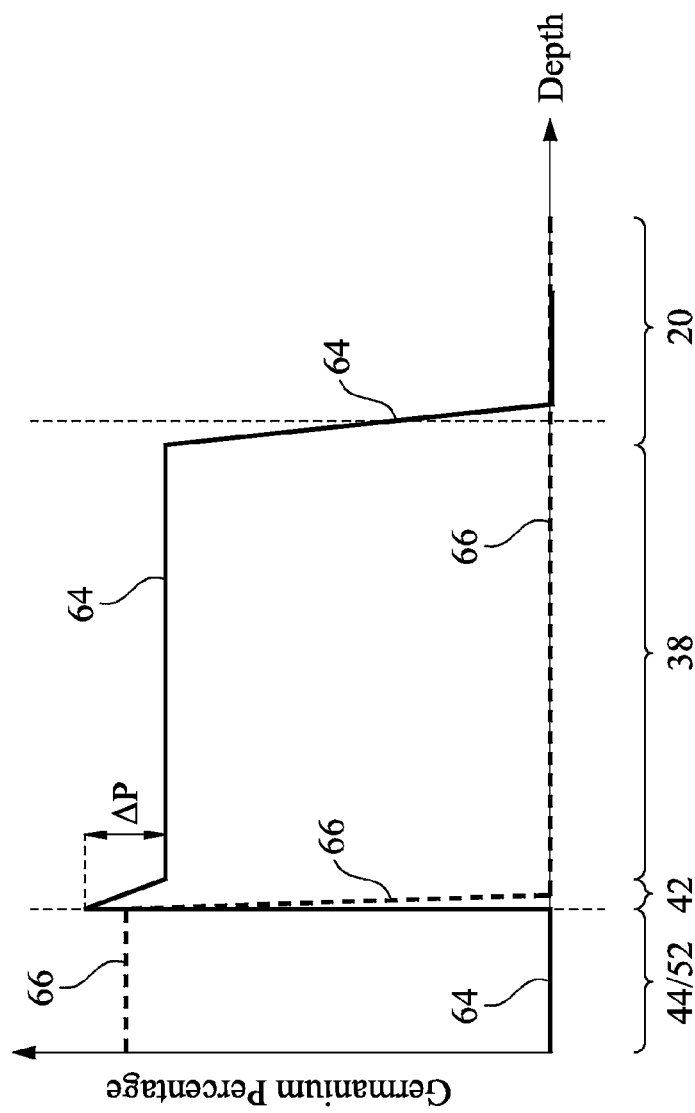
FIG. 12 schematically illustrates exemplary profiles of germanium percentages and the amount of silicide metal in several regions of the MOS device in accordance with alternative embodiments.

FIG. 12 schematically illustrates the germanium profile (line 64) in the source and drain regions and source/drain silicide regions of MOS device 60. Line 64 represents the germanium percentage along the path of arrow 62 in FIG. 10. The respective regions 38, 42, and 44/52 in FIG. 10 are also illustrated in FIG. 12 to show the correspondence between the germanium percentages and the respective regions. The X-axis illustrates the depth measured starting from the top surface of silicide regions 52 (FIG. 10). The Y-axis indicates the schematic germanium percentage. Since FIG. 12 is schematic, the values of the X-axis and the Y-axis are not marked. As shown in FIG. 12, the germanium percentage (line 64) in the top portion of silicide regions 52 is very low.

FIG. 12 also schematically illustrates the metal profile (line 66) in the source and drain regions of MOS device 60, wherein line 66 reflects the relative amount of the silicide metal (for example, nickel or cobalt). In the example shown FIG. 12, silicide regions 52 is formed by siliciding capping layers 44, and substantially no piled-up SiGe regions 42 are silicided. Accordingly, in FIG. 12, the amount of silicide metal significantly reduces going into piled-up SiGe regions 42. In alternative embodiments, the amount of silicide metal may reduce at an intermediate level of piled-up SiGe regions 42.

In the embodiments of the present disclosure, source/drain silicide regions are formed to have bottom surfaces contacting the underlying piled-up SiGe layers, which have a high germanium percent. As a result, the Schottky barrier height between the source/drain silicide regions and the respective underlying piled-up SiGe layers is reduced compared to the barrier height between the source/drain silicide regions and a SiGe layer with a lower germanium percentage. The contact resistance of the source/drain contact is thus reduced. The increased germanium percentage, however, causes the morphology in the resulting silicide to degrade, which may cause metal segregation in the silicide region. In the embodiments of the present disclosure, however, the thickness of the pile-up SiGe layer that has the high germanium percentage is very small, and the respective silicide formed due to the silicidation of the pile-up SiGe layer is very thin, and hence the degradation in morphology has minimized effect on the quality of the source/drain silicide.

In accordance with some embodiments, an integrated circuit structure includes a gate stack over a semiconductor substrate, and an opening extending into the semiconductor substrate, wherein the opening is adjacent to the gate stack. A first silicon germanium region is disposed in the opening, wherein the first silicon germanium region has a first germanium percentage. A second silicon germanium region is overlying the first silicon germanium region, wherein the second silicon germanium region has a second germanium percentage higher than the first germanium percentage. A metal silicide region is over and in contact with the second silicon germanium region.

In accordance with other embodiments, an integrated circuit structure includes a semiconductor substrate, and a gate stack over the semiconductor substrate, wherein the gate stack is comprised in a MOS device. A source/drain region of the MOS device extends into the semiconductor substrate. The source/drain region includes a first silicon germanium region, which has a first germanium percentage. The source/drain region further includes a second silicon germanium region over the first silicon germanium region, wherein the second silicon germanium region has a second germanium percentage greater than the first germanium percentage. A silicon cap is over and contacting the second silicon germanium region. A metal silicide region penetrates through the silicon cap to contact the second silicon germanium region.

In accordance with yet other embodiments, a method includes forming a gate stack over a semiconductor substrate, and forming an opening extending into the semiconductor substrate, wherein the opening is on a side of the gate stack. A first epitaxy is performed to grow a first silicon germanium region in the opening, wherein the first silicon germanium region has a first germanium percentage. A second epitaxy is performed to grow a second silicon germanium region over the first silicon germanium region, wherein the second silicon germanium region has a second germanium percentage higher than the first germanium percentage. The method further includes forming silicon cap substantially free from germanium over and contacting the second silicon germanium region.

In one aspect, embodiments described herein provide for an integrated circuit structure comprising: a semiconductor substrate; a recess in the semiconductor substrate; a first silicon germanium region substantially filling the opening and having a topmost surface extending above a topmost surface of the substrate, wherein the first silicon germanium region has a first germanium percentage; a second silicon germanium region on the topmost surface of the first silicon germanium region, wherein the second silicon germanium region has a second germanium percentage higher than the first germanium percentage; and a metal silicide above and extending partly into the second silicon germanium region.

In another aspect, embodiments described herein provide for an integrated circuit a semiconductor substrate; a gate stack over the semiconductor substrate; and a source region adjacent a first side of the gate stack. The source region includes: a first silicon germanium region having a first germanium percentage, the first silicon germanium region extending into the semiconductor substrate and having a topmost surface extending to at least a topmost surface of the semiconductor substrate; a second silicon germanium region on the first silicon germanium region, the second silicon germanium region having a second germanium percentage higher than the first germanium percentage; and a metal silicide above and extending partly into the second silicon germanium region.

In yet another aspect, embodiments described herein provide for a method of forming an integrated circuit comprising: forming a dummy gate stack; etching a source recess and a drain recess adjacent respective sides of the dummy gate stack; epitaxially growing a first silicon germanium layer in the source recess and in the drain recess, the first silicon germanium layer having a first germanium percentage; epitaxially growing a second silicon germanium layer on the first silicon germanium layer in the source recess and the drain recess, the second silicon germanium layer having a second germanium percentage higher than the first germanium percentage; forming a cap layer over the second silicon germanium layer; forming a metal over a portion of the cap layer; and siliciding the cap layer and a portion of the second silicon germanium layer to form a silicide region over the source recess and over the drain recess, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
   a semiconductor substrate;
   a recess in the semiconductor substrate;
   a first silicon germanium region substantially filling the recess and having a topmost surface extending above a topmost surface of the semiconductor substrate, wherein the first silicon germanium region has a first germanium percentage;
   a second silicon germanium region on the topmost surface of the first silicon germanium region, wherein the second silicon germanium region has a second germanium percentage higher than the first germanium percentage; and
   a metal silicide above and extending partly into the second silicon germanium region.

2. The integrated circuit of claim 1, wherein the first germanium percentage is from about 30 percent to about 60 percent and wherein the second germanium percentage is from about 35 percent to about 80 percent.

3. The integrated circuit of claim 1, wherein the first silicon germanium region further includes impurities at an impurity concentration of from about $5E18/cm^3$ to about $5E21/cm^3$.

4. The integrated circuit of claim 3, wherein the impurities are boron.

5. The integrated circuit of claim 1, wherein the metal silicide has a substantially cup shaped form.

6. The integrated circuit of claim 1, wherein the germanium percentage in the first silicon germanium region is substantially uniform through the first silicon germanium region.

7. The integrated circuit of claim 1, wherein the germanium percentage in the first silicon germanium region gradually and continuously changes through the first silicon germanium region.

8. An integrated circuit comprising:
a semiconductor substrate;
a gate stack over the semiconductor substrate; and
a source region adjacent a first side of the gate stack, the source region including:
a first silicon germanium region having a first germanium percentage, the first silicon germanium region extending into the semiconductor substrate and having a topmost surface extending to at least a topmost surface of the semiconductor substrate;
a second silicon germanium region on the first silicon germanium region, the second silicon germanium region having a second germanium percentage higher than the first germanium percentage;
a metal silicide above and extending partly into the second silicon germanium region; and
a cap layer on the second silicon germanium region, the cap layer being substantially free of germanium.

9. The integrated circuit of claim 8, further comprising:
a drain region adjacent a second side of the gate stack, the drain region including:
a third silicon germanium region having a third germanium percentage equal to the first germanium percentage; and
a fourth silicon germanium region having a fourth germanium percentage equal to the second germanium percentage; and
a second metal silicide above and extending partly into the fourth silicon germanium region.

10. The integrated circuit of claim 8, further comprising:
a cap layer formed atop the second silicon germanium region, wherein the metal silicide extends through an opening in the cap layer.

11. The integrated circuit of claim 8, wherein the cap layer has an annular shape surrounding the metal silicide when viewed from a top down perspective.

12. The integrated circuit of claim 8, wherein the first germanium percentage is from about 30 percent to about 60 percent and wherein the second germanium percentage is from about 35 percent to about 80 percent.

13. The integrated circuit of claim 8, wherein the first silicon germanium region further includes impurities at an impurity concentration of from about $5E18/cm^3$ to about $5E21/cm^3$.

14. The integrated circuit of claim 13, wherein the impurities are boron.

15. The integrated circuit of claim 8, wherein the first silicon germanium region fills a hole in the semiconductor substrate and wherein sidewalls of the hole comprises facets along planes of the semiconductor crystal structure.

16. The integrated circuit of claim 8, wherein the second silicon germanium region abuts a gate spacer of the gate stack.

17. A method of forming an integrated circuit comprising:
forming a dummy gate stack;
etching a source recess and a drain recess adjacent respective sides of the dummy gate stack;
epitaxially growing a first silicon germanium layer in the source recess and in the drain recess, the first silicon germanium layer having a first germanium percentage;
epitaxially growing a second silicon germanium layer on the first silicon germanium layer in the source recess and the drain recess, the second silicon germanium layer having a second germanium percentage higher than the first germanium percentage;
forming a cap layer over the second silicon germanium layer;
forming a metal over a portion of the cap layer; and
siliciding the cap layer and a portion of the second silicon germanium layer to form a silicide region over the source recess and over the drain recess, respectively.

18. The method of claim 17, further comprising removing the dummy gate stack and forming in its place an operative gate stack.

19. The method of claim 17, further comprising forming a source contact plug contacting the silicide region over the source recess and forming a drain contact plug contacting the silicide region over the drain recess.

20. The integrated circuit of claim 1, further including a cap layer over the second silicon germanium region, wherein the metal silicide extends through an opening of the cap layer.

* * * * *